United States Patent
Kojima

(10) Patent No.: US 10,460,776 B2
(45) Date of Patent: Oct. 29, 2019

(54) SEMICONDUCTOR MEMORY DEVICE AND READING METHOD FOR THE SAME

(71) Applicant: Winbond Electronics Corp., Taichung (TW)

(72) Inventor: Hidemitsu Kojima, Taichung (TW)

(73) Assignee: WINBOND ELECTRONICS CORP., Taichung (TW)

( * ) Notice: Subject to any disclaimer, the term of this patent is extended or adjusted under 35 U.S.C. 154(b) by 0 days.

(21) Appl. No.: 15/869,721

(22) Filed: Jan. 12, 2018

(65) Prior Publication Data
US 2018/0204606 A1    Jul. 19, 2018

(30) Foreign Application Priority Data
Jan. 13, 2017   (JP) .................. 2017-003785

(51) Int. Cl.
| | | |
|---|---|---|
| *G11C 7/02* | (2006.01) | |
| *G11C 7/12* | (2006.01) | |
| *G11C 7/10* | (2006.01) | |
| *G11C 7/06* | (2006.01) | |
| *G11C 16/32* | (2006.01) | |
| *G11C 16/26* | (2006.01) | |
| *G11C 16/04* | (2006.01) | |

(52) U.S. Cl.
CPC ............... *G11C 7/12* (2013.01); *G11C 7/06* (2013.01); *G11C 7/109* (2013.01); *G11C 16/26* (2013.01); *G11C 16/32* (2013.01); *G11C 16/0483* (2013.01); *G11C 2216/14* (2013.01)

(58) Field of Classification Search
None
See application file for complete search history.

(56) References Cited

U.S. PATENT DOCUMENTS

| | | | |
|---|---|---|---|
| 2002/0141515 A1 | 10/2002 | Enam et al. | |
| 2007/0002623 A1* | 1/2007 | Won .................. | G11C 16/08 365/185.12 |
| 2007/0244951 A1 | 10/2007 | Gressel et al. | |
| 2011/0069738 A1 | 3/2011 | Sugino et al. | |
| 2014/0059268 A1* | 2/2014 | Adachi .................. | G06F 12/00 711/102 |

FOREIGN PATENT DOCUMENTS

JP        2012253591 A      12/2012

* cited by examiner

*Primary Examiner* — Uyen B Tran
(74) *Attorney, Agent, or Firm* — Muncy, Geissler, Olds & Lowe, P.C.

(57) ABSTRACT

A semiconductor memory device is provided. The semiconductor memory device includes a column selection circuit, a sensing circuit, an output circuit, and a verification circuit. The column selection circuit selects n-bit data from data read from a memory cell array according to a column selection signal and outputs the selected n-bit data to an n-bit data bus. The sensing circuit senses the n-bit data on the data bus in response to an activation signal. The output circuit selects m-bit data from the n-bit data sensed by the sensing circuit in response to an internal clock signal synchronized with a serial clock signal applied from outside and outputs the selected m-bit data from output terminals. The verification circuit compares the data sensed by the sensing circuit with the data output by the output circuit to verifying the correctness of read-out data.

10 Claims, 6 Drawing Sheets

SEMICONDUCTOR MEMORY DEVICE AND READING METHOD FOR THE SAME

CROSS REFERENCE TO RELATED APPLICATIONS

This Application claims priority of Japan Patent Application No. JP2017-003785, filed on Jan. 13, 2017, the entirety of which is incorporated by reference herein.

BACKGROUND OF THE INVENTION

Field of the Invention

The invention relates to a data reading method for a semiconductor memory device, and more particularly to a method for verifying data read from a NAND flash memory with a serial interface function.

Description of the Related Art

In a NAND flash memory, data is read and programmed in a unit of one page, and the page data is stored in a page buffer. The flash memory disclosed in Patent Document 1 has a first mode in which the data stored is transmitted in a first bit-width and a second mode in which the data is transmitted in a second bit-width, and these modes correspond to several operation modes.

[Patent Document 1]: Japanese Patent Publication No. 2012-253591.

A NAND flash memory are equipped with a serial interface for serially inputting/outputting data through a small number of terminals. The serial interface includes, for example, a serial peripheral interface (SPI) standardized with an 8-bit instruction code and a 24-bit address. A NAND flash memory equipped with an SPI receives a serial clock signal from the outside and inputs/outputs data, addresses, and commands in synchronization with the serial clock signal.

FIG. 1 is a schematic view showing a sequential read operation of a NAND flash memory equipped with a serial interface function. In the read operation, one page of a memory cell array is selected according to a row address, and the data "0" or "1" of the selected page is held in a page buffer 10.

For example, the page buffer 10 can include two stages of internal latch circuits to perform pipeline processing of data. A column decoder 20 decodes a column address CA and outputs a column selection signal YS, which is used for selecting n-bit data from the page data held in the page buffer 10, to a column selection circuit (not shown) through a driver 22. The column selection signal YS. The column selection circuit selects n-bit data from the page data held in the latch circuit of the page buffer 10 according to the column selection signal YS, and the selected n-bit data serves as "0", "1" of differential data and is output to bit line pairs BT/BB of a data bus 40.

The n-bit bit line pairs BT/BB are connected to n differential sensing amplifiers 30, and these n differential sensing amplifiers 30 are activated by n activation signals SAE from a timing control circuit 50 respectively. When activated, the differential sensing amplifiers 30 sense the differential data of the bit line pairs BT/BB. The n-bit data sensed by the differential sensing amplifiers 30 is fetched to an input/output circuit 60.

The input/output circuit 60 comprises a parallel/serial conversion circuit composed of m connected flip-flops. In response to an internal clock signal PSCCLK, the m-bit data selected from the n-bit data sensed by the differential sensing amplifiers 30 is input to the parallel/serial conversion circuit in parallel, and the parallel/serial conversion circuit converts it to serial data. The converted serial data is output to the outside from m-bit input/output terminals I/O through a driver 62.

A serial clock signal SCLK is applied to an SCK terminal from the outside and then provided to the timing control circuit 50 and the column decoder 20 through the receiver 70. The timing control circuit 50 generates the clock signal PSCCLK synchronized with the serial clock signal SCLK and further generates the activation signals SAE which are asynchronous with the serial clock signal SCLK.

The number n of bits selected by the column decoder 20 each time is equal to the bit width of the data bus 40, that is, the number of bit line pairs BT/BB. The number of I/O terminals is equal to an arbitrary number. However, when the number of I/O terminals is equal to m (that is the I/O terminals are for m bits), m a n and n is k times as large as m (each of m and k is an integer which is equal to 1 or larger than 1). When m is smaller than n, the n bits of the data bus 40 are fetched into the input/output circuit 60 according to the clock signal PSCCLK in a plurality of cycles. For example, in cases where the bit line pairs BT/BB of the data bus 40 are for 8 bits, if the number of I/O terminals is equal to 4, 4 bit data is selected from the 8-bit data sensed by the differential sensing amplifiers 30 according to the clock signal PSCCLK in the first cycle, the selected 4-bit data is fetched to the input/output circuit 60 in parallel, and the 4-bit data which has been converted to serial data is output by four I/O terminals simultaneously. Then, the remaining 4-bit data is selected according to the clock signal PSCCLK in the second cycle, the selected 4-bit data is fetched to the input/output circuit 60, and the 4-bit data which has been converted to serial data is output by four I/O terminals simultaneously. The method of selecting 4-bit data is arbitrary. For example, first, 4 even bits of the data bus 40 are selected first, and then 4 odd number bits are selected, or the upper 4 bits of the data bus 40 are selected first, and then the lower 4 bits of the data bus are selected.

FIG. 2 shows a timing chart of the sequential read operation of serial data in the NAND flash memory. In this example, I/O terminals is a quad type (m=4), and the data bus 40 is for 8 bits (n=8). Therefore, the 8-bit data sensed by the differential sensing amplifiers 30 is fetched to the input/output circuit 60 according to the clock signal PSCCLK in two cycles. For every cycle, 4 bits are fetched to the input/output circuit 60. For the sequential reading, the column address is automatically increased by an address counter, and the next n-bit data is input to the data bus 40 from the page buffer 10 in response to the increment. In the sequential reading, it is also possible to continuously output data of one page or to continuously output data of a plurality of pages.

At the time point t0, the serial clock signal SCLK is input from the outside. At the time point t1 delayed from the serial clock signal SCLK by a fixed period, the column selection signal YS is output to the column selection circuit, and the column selection circuit selects 8-bit data from the data of one page held in the page buffer 10. The selected 8-bit data serves as differential data and then is output to the n-bit bit line pairs BT/BB of the data bus 40.

The n-bit bit line pairs BT/BB are connected to the plurality of latch circuits of the page buffer 10 through a plurality of column selection transistors of the column selection circuit. Moreover, since the column selection transistors which are selected according to the column selection signal YS are turned on, the latch circuits are electrically connected to the bit line pairs BT/BB. Since the physical wirings of the bit line pairs BT/BB exist as many as the number of page buffers which the bit line pairs BT/BB are connected to, the wiring capacitance and the wiring resistance of the bit line pairs BT/BB are relatively large, and the data of one bit line pair BT/BB is sensed by only one differential sensing amplifier 30. Therefore, the potential difference between one bit line pair BT/BB becomes larger, and a certain time is required so that the corresponding differential sensing amplifier 30 can sense the potential difference.

At the time point t2 when the differential sensing amplifiers 30 can sense the potential difference of the bit line pairs BT/BB, the timing control circuit 50 outputs the activation signals SAE. The differential sensing amplifiers 30 sense the data D1[7:0] of the bit line pairs BT/BB of the data bus 40 in response to the rising edges of the activation signals SAE.

Next, at time point t3, the timing control circuit 50 outputs the clock signal PSCCLK in the first cycle. The clock signal PSCCLK is obtained by delaying the serial clock signal SCLK by a fixed time period. In response to the rising edge of the clock signal PSCCLK, the input/output circuit 60 inputs the 4-bit data D1[7:4] selected from the 8-bit data sensed by the differential sensing amplifiers 30 in parallel converts it to serial data, and then outputs serial data from four I/O terminals simultaneously. Next, at the time point t4, the clock signal PSCCLK in the second cycle is output to the input/output circuit 60, and the input/output circuit 60 outputs the remaining 4-bit data D1[3:0] sensed by the differential sensing amplifiers 30 in parallel, converts it into serial data, and outputs serial data from four I/O terminals simultaneously.

An NAND flash memory equipped with a serial interface function is requested to operate in a high speed to achieve compatibility with a NOR serial flash memory. When the operation frequency of the serial clock signal SCLK becomes high, in the read operation, the read-out data cannot be accurately fetched to the input/output circuit 60 by a pipeline in response to the internal clock signal PSCCLK synchronized with the serial clock signal SCLK, and thus incorrect data may be output.

FIG. 3 is a schematic view showing a problem when the operation frequency of the serial clock signal SCLK becomes high. A certain amount of time is required for that the data is loaded from the page buffer 10 to the data bus 40 and the potential difference between the bit line pairs BT/BB become sufficient. Thus, the latency becomes very large. For this reason, a sufficient margin is given during the period from the rising edge of the column selection signal YS at the time point t1 to the rising edges of the activation signals SAE at the time point t2. However, in cases where the timing of the rising edges of the activation signals SAE is too late, when the clock signal PSCCLK in the first cycle synchronized with the serial clock signal SCLK is input to the input/output circuit 60 from the timing control circuit 50 at the time point ta, the data D1[7:4] of the data bus 40 cannot be fetched in time, the previous data D0[7:4] is fetched instead. Similarly, in cases where the operation of reading the next data D2[7:0] is performed, the previous data D1[7:4] is fetched, and as a result, incorrect read-out data is output.

In order to prevent such errors in the read-out data in advance, it is necessary to verify whether the read-out data is correct and further to properly adjust the timing of the activation signals SAE when the read-out data is incorrect.

BRIEF SUMMARY OF THE INVENTION

It is an object of the present invention to provide a semiconductor memory device having a verification circuit for verifying whether read-out data is correct and a read method therefor to solve conventional problems.

An exemplary embodiment of a semiconductor memory device is provided. The semiconductor memory device comprises a column selection circuit, a sensing circuit, an output circuit, and a verification circuit. The column selection circuit selects n-bit data from data read from a memory cell array according to a column selection signal and outputs the selected n-bit data to an n-bit data bus. The sensing circuit senses the n-bit data on the data bus in response to an activation signal. The output circuit selects m-bit data from the n-bit data sensed by the sensing circuit in response to an internal clock signal synchronized with a serial clock signal applied from outside and outputs the selected m-bit data from output terminals. The verification circuit compares the data sensed by the sensing circuit with the data output by the output circuit to verify the correctness of read-out data. m is an integer which is equal to 1 or larger than 1 and n≥m, and the internal clock signal having n/m cycles is generated in one cycle of the activation signal.

In a preferred embodiment, the data output to the data bus from the column selection circuit is differential data, and the sensing circuit is coupled to sense the differential data. In another preferred embodiment, the verification circuit is coupled to verify the correctness of the read-out data of the end which is a farthest data in view of the column selection signal. In another preferred embodiment, the semiconductor memory device further comprises a timing control circuit which is coupled to control the timing of the activation signal according to a verification result of the verification circuit. In another preferred embodiment, when the verification circuit verifies that the read-out data is incorrect, the timing control circuit controls the timing of the activation signal by advancing a time at which the sensing circuit starts sensing the data. In another preferred embodiment, the output circuit comprises a conversion circuit which is coupled to convert a data which is input in parallel into a data which is output in serial in response to the internal clock signal. In further another embodiment, the semiconductor memory device is a NAND flash memory with a serial interface function.

An exemplary embodiment of a data reading method for a semiconductor memory device is provided. The data reading method comprises the steps of selecting page data of a memory cell array according to a column address; selecting n-bit data from the page data according to a column selection signal and outputting the selected n-bit data to an n-bit data bus; sensing the n-bit data on the n-bit data bus in response to an activation signal; selecting m-bit data from the sensed n-bit data in response to an internal clock signal synchronized with a serial clock signal applied from outside and outputting the selected m-bit data from output terminals; and comparing the sensed data with the selected data to verify the correctness of read-out data. m is an integer which is equal to 1 or larger than 1 and n≥m, and the internal clock signal having n/m cycles is generated in one cycle of the activation signal.

In a preferred embodiment the data reading method further comprises the step of controlling timing of the activation signal when it is verified that the output-out data is incorrect.

According to the embodiments of the present invention, the correctness of the read-out data can be verified by the verification circuit. Furthermore, when the verification circuit verifies that the read-out data is incorrect, the m-bit data can be selected from the n-bit data sensed by the sensing circuit correctly by controlling the timing of the activation signal. Accordingly, it will be able to output correct read-out data even when the operation frequency of the serial clock signal supplied from the outside becomes high.

BRIEF DESCRIPTION OF THE DRAWINGS

The invention can be more fully understood by referring to the following detailed description and examples with references made to the accompanying drawings, wherein.

DETAILED DESCRIPTION OF THE INVENTION

Hereinafter, embodiments of the present invention will be described in detail with reference to the drawings. In a preferred embodiment, the read-out data verification circuit of the present invention is configured in a semiconductor device (for example, a NAND flash memory or other semiconductor memory) having a serial interface. In another preferred embodiment, the read-out data verification circuit of the present invention can be externally connected to a semiconductor device having a serial interface. The serial interface comprises, for example, a terminal for inputting a serial clock SCLK, terminals for inputting/outputting data, commands, addresses and the like, a terminal for performing a chip selection, and the like.

Figure 1:
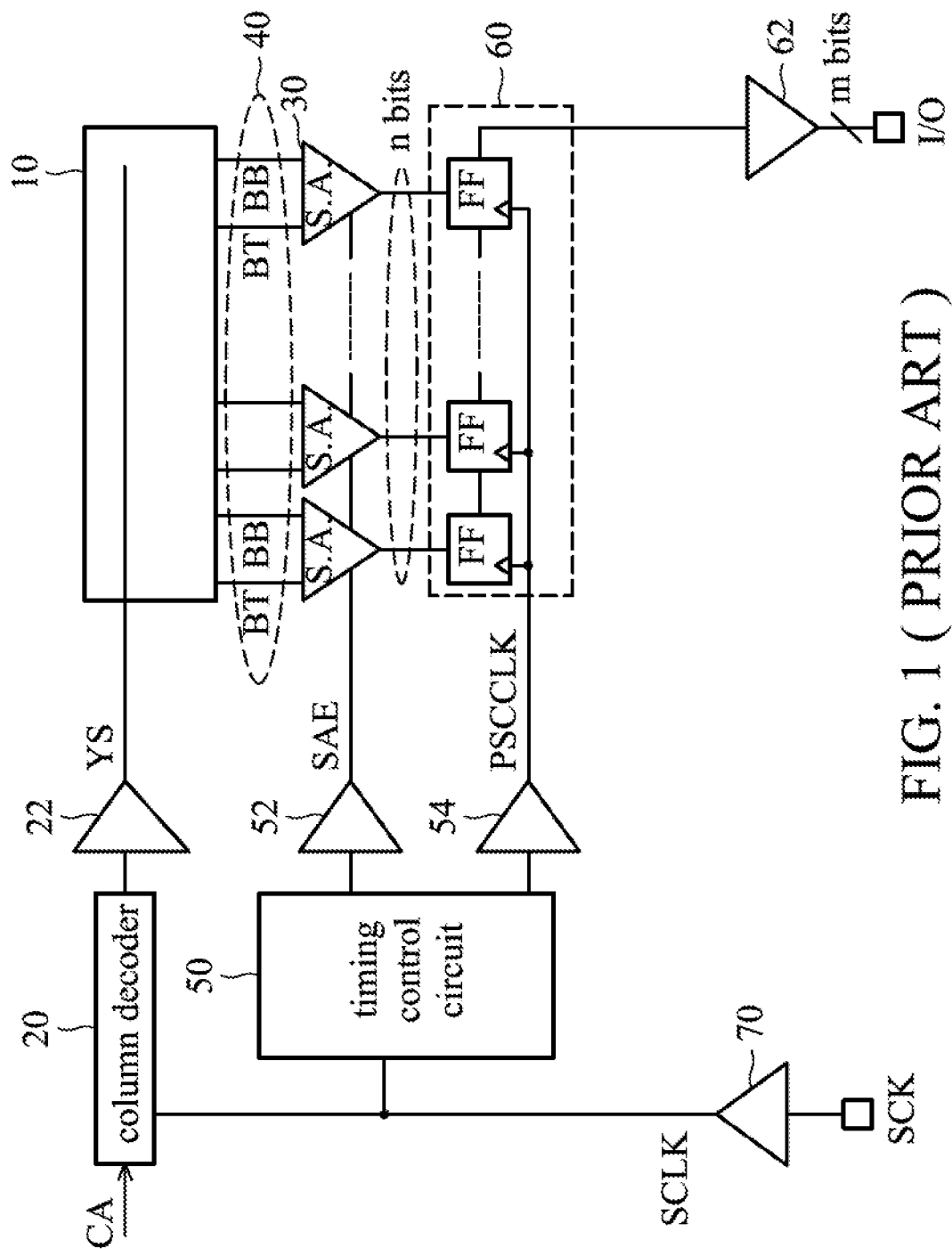
FIG. 1 is a schematic view showing a sequential read operation of a conventional flash memory.
Figure 2:
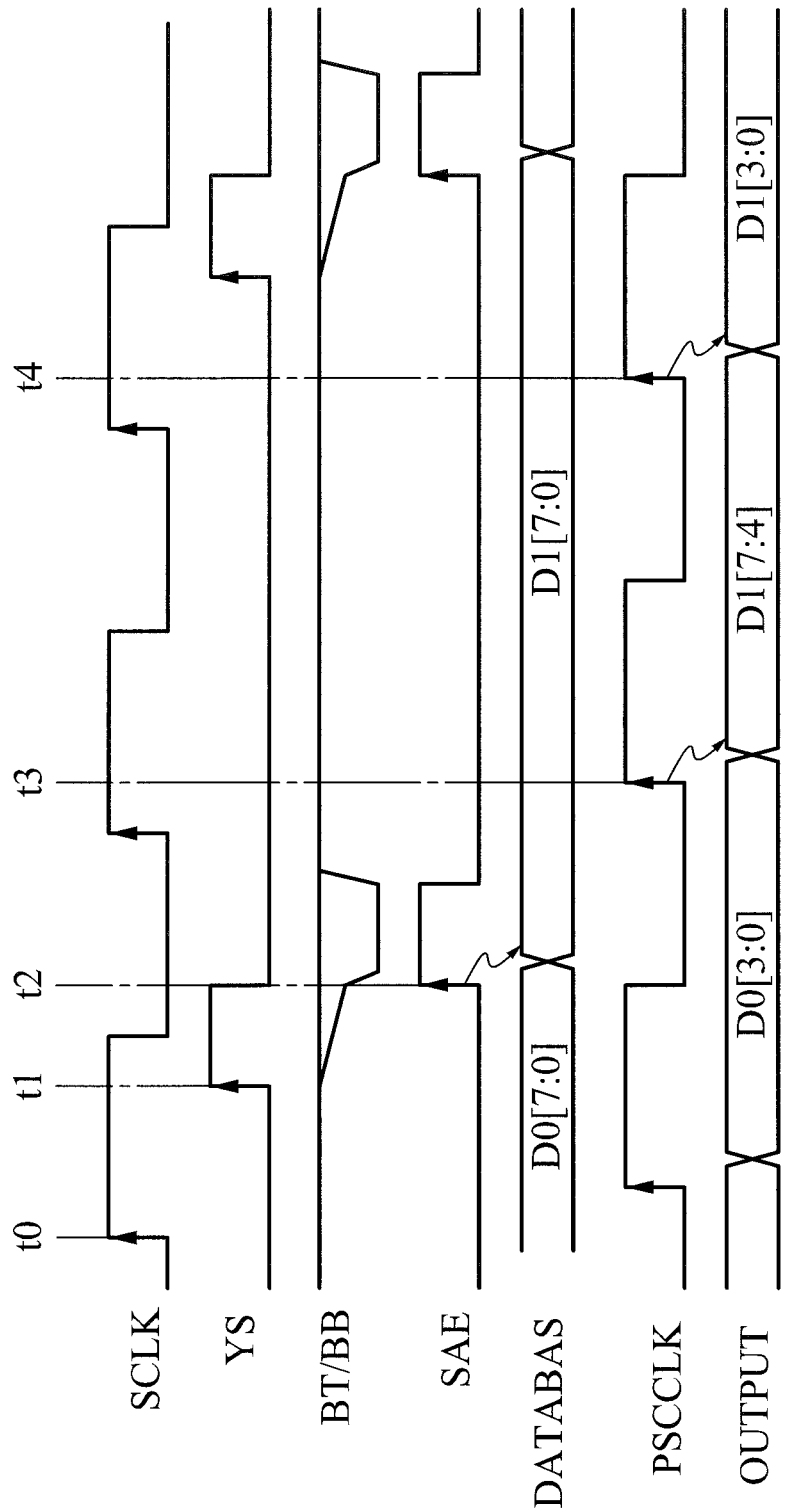
FIG. 2 shows a timing chart of a sequential read operation of a conventional flash memory.
Figure 3:
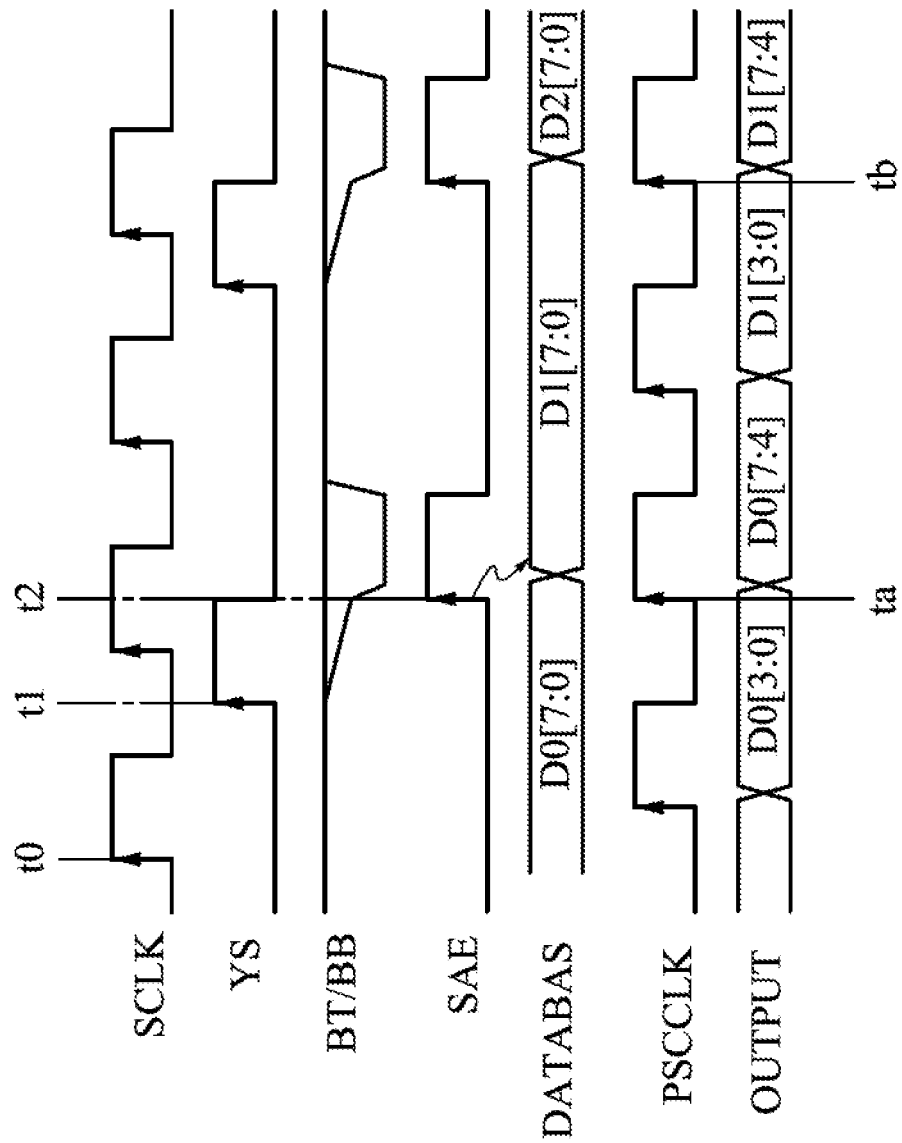
FIG. 3 is a schematic view showing a problem induced when a conventional flash memory is performing a sequential read operation.
Figure 4:
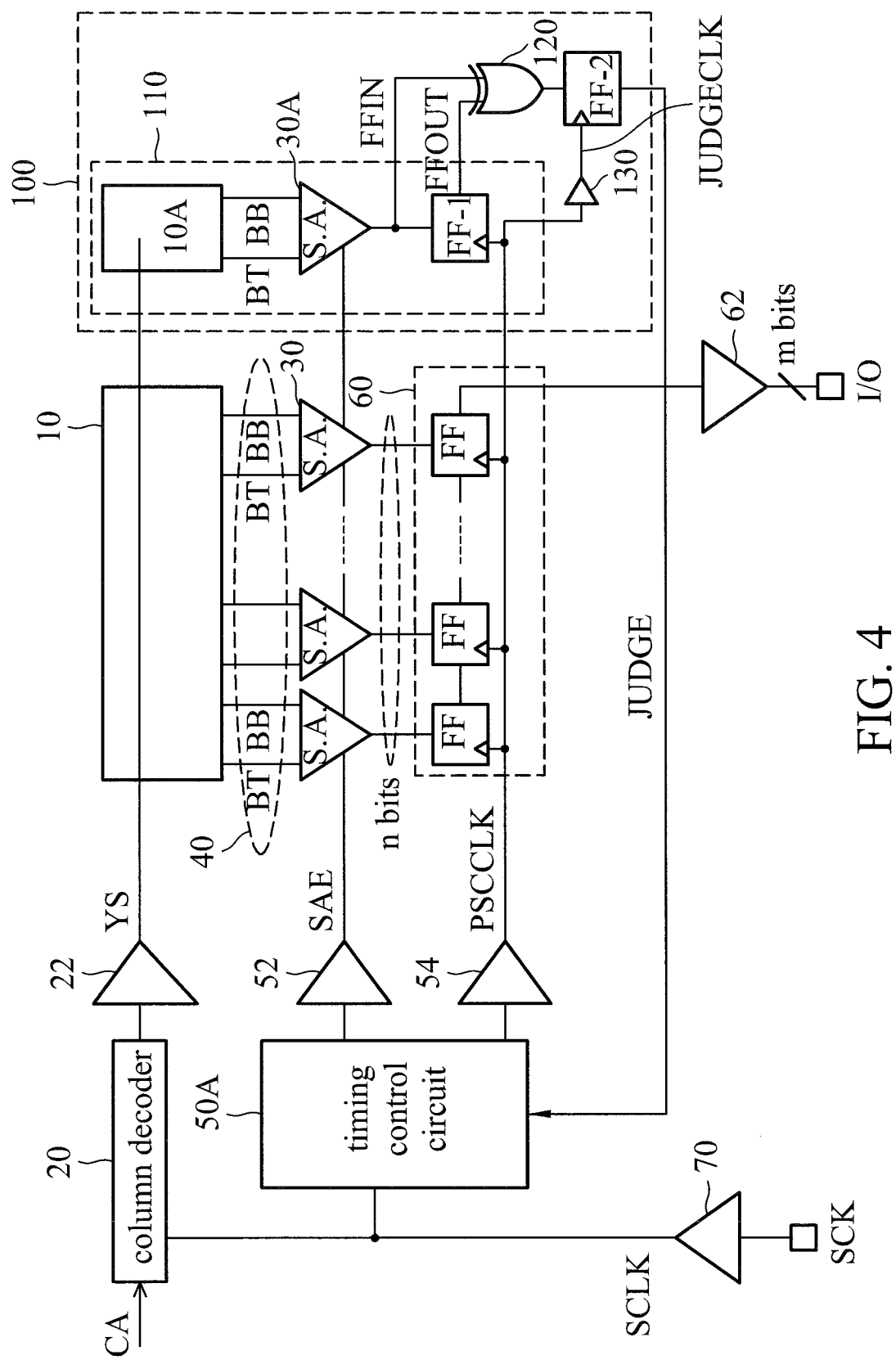
FIG. 4 shows an exemplary embodiment of a read-out data verification circuit configuration of a flash memory.

Next, embodiments of the present invention will be described. FIG. 4 an exemplary embodiment of a verification circuit 100 configured in a flash memory, and the same reference numerals are attached to the same components as those shown in FIG. 1.

The verification circuit 100 preferably comprises a duplication circuit 110 which is formed by duplicating a part of the page buffer 10, the differential sensing amplifiers 30, and the input/output circuit 60. That is, the duplication circuit 110 comprises, for example, a holding circuit (latch circuit) 10A that holds data of 1 bit, a differential sensing amplifier 30A that senses the differential data output from the holding circuit 10A to the 1-bit bit line pair BT/BB, and a flip-flop FF-1 that receives the data sensed by the differential sensing amplifier 30A. However, the verification circuit 100 does not necessarily require the duplicate circuit 110, and it may share the page buffer 10, the differential sensing amplifiers 30, and the input/output circuit 60 that are actually used. In this case, the holding circuit 10A may be, for example, a redundant region of the memory cell array.

In a preferred embodiment, the duplication circuit 110 is configured at the position of the farthest end of the page buffer 10 in view of the column selection signal YS of the column decoder 20, so that the physical distance of the column selection signal YS is the longest. Based on the characteristic of the column selection signal YS, latency at the position where the physical distance is the farthest for the column selection signal YS. That is, due to the load capacitance and the load resistance of the signal line of the column selection signal YS, the attenuation of the column selection signal YS at the far end becomes greater than at the near end, and thus the potential difference between the bit line pair BT/BB sensed by the differential sensing amplifier becomes smaller than that at the near end. By configuring the duplication circuit 110 at the furthest end of the page buffer 10, it is possible to realize the worst characteristic of the latency of the column selection signal YS, whereby obtaining the high reliable verification of the read-out data.

The verification circuit 100 further comprises a determination circuit for determining whether the read-out data is correct. The determination circuit comprises an EX-OR circuit 120 which receives data FFIN and data FFOUT. The data FFIN is the sensing output of the differential sensing amplifier 30A and input to the flip-flop FF-1. The data FFOUT is the output of the flip-flop FF-1. When the data FFIN is different from the data FFOUT, the determination circuit outputs an H level. When the data FFIN is the same as the data FFOUT, the determination circuit outputs an L level. The determination circuit further comprises a flip-flop FF-2 which is triggered by a determination clock signal JUDGECLK to fetch the output of the EX-OR circuit 120. The determination clock signal JUDGECLK is delayed from the clock signal PSCCLK. The output of the flip-flop FF-2 serves as a determination signal JUDGE which is fed back to the timing control circuit 50. The determination clock signal JUDGECLK input to the flip-flop FF-2 is a signal obtained by delaying the clock signal PSCCLK by the delay element 130 for a fixed time.

The timing control circuit 50A generates an activation signal SAE for timing adjustment according to the serial clock signal SCLK input from the receiver 70 and outputs the activation signal SAE to the differential sensing amplifiers 30 and 30A through a driver 52. Specifically, the timing control circuit 50A controls the timing of the activation signal SAE so that the number of cycles of the clock signal PSCCLK corresponding to the timing of the activation signal SAE becomes appropriate. When the number of I/O terminals is m and the number of the bit line pairs BT/BB of the data bus 40 is n, the number of times of fetching to the input/output circuit 60 from the data bus 40 is equal to n/m. There are n/m cycles of the clock signal PSCCLK per cycle of the activation signal SAE (in the embodiment, m=4 and n=8, therefore two cycles of the clock signal PSCCLK is required per cycle of the activation signal SAE). Furthermore, the timing control circuit 50A provides the internal clock signal PSCCLK, which is delaying the serial clock signal SCLK by a fixed time period, to the input/output circuit 60, the flip-flop FF-1, and a delay element 130 through a driver 54.

Furthermore, the timing control circuit 50A of the present embodiment adjusts the timing of the activation signal SAE based on the determination signal JUDGE of the flip-flop FF-2. When the determination signal JUDGE is at the H level, that is, when the input data FFIN of the flip-flop FF-1 sensed by the differential sensing amplifier 30A is different from the output data FFOUT, the rising edge of the activation signal SAE is adjusted, so that the timing of asserting the differential sensing amplifiers 30 is advanced. However, the range of time by which the activation signal SAE can be advanced does not exceed the timing at which the potential difference between the bit line pairs BT/BB can be sensed by the differential sensing amplifiers 30. The time breadth for adjusting the timing of the activation signal SAE can be set arbitrarily. For example, the timing of the activation signal SAE is advanced by a predetermined time breadth, or the timing of the activation signal SAE is adjusted automatically before the determination signal JUDGE becomes to the L level by using a PLL circuit or DLL circuit. On the other hand, when the determination signal JUDGE is at the L level, that is, when the input data FFIN of the flip-flop FF-1 sensed by the differential sensing amplifier 30A is the same as the output data FFOUT, since the correct read-out data is fetched to the input/output circuit 60, the timing control circuit 50A maintains the current state without changing the timing of the activation signal SAE.

Figure 5A:
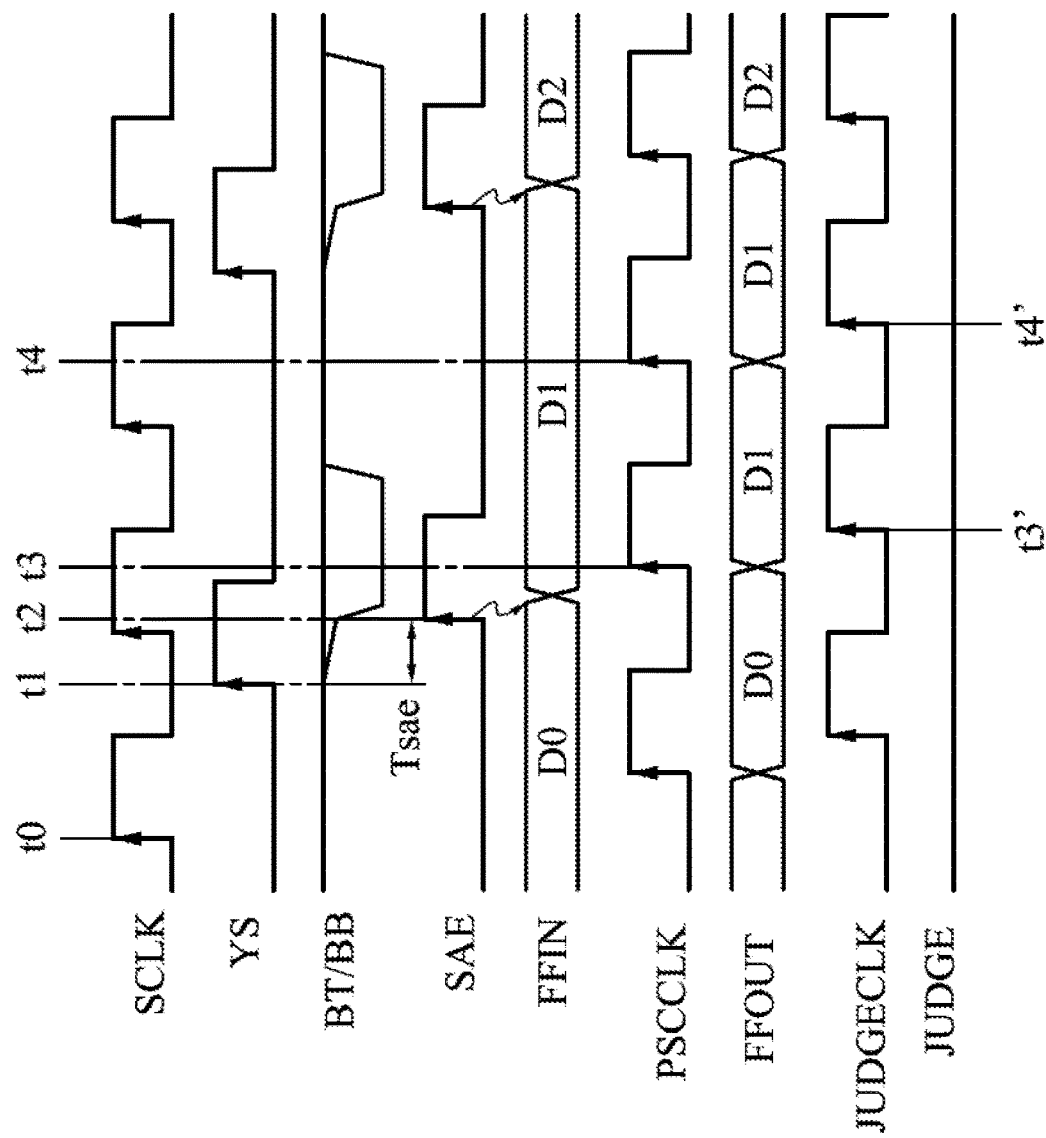
FIGS. 5A and 5B show timing charts of an operation of a verification circuit.
Figure 5B:
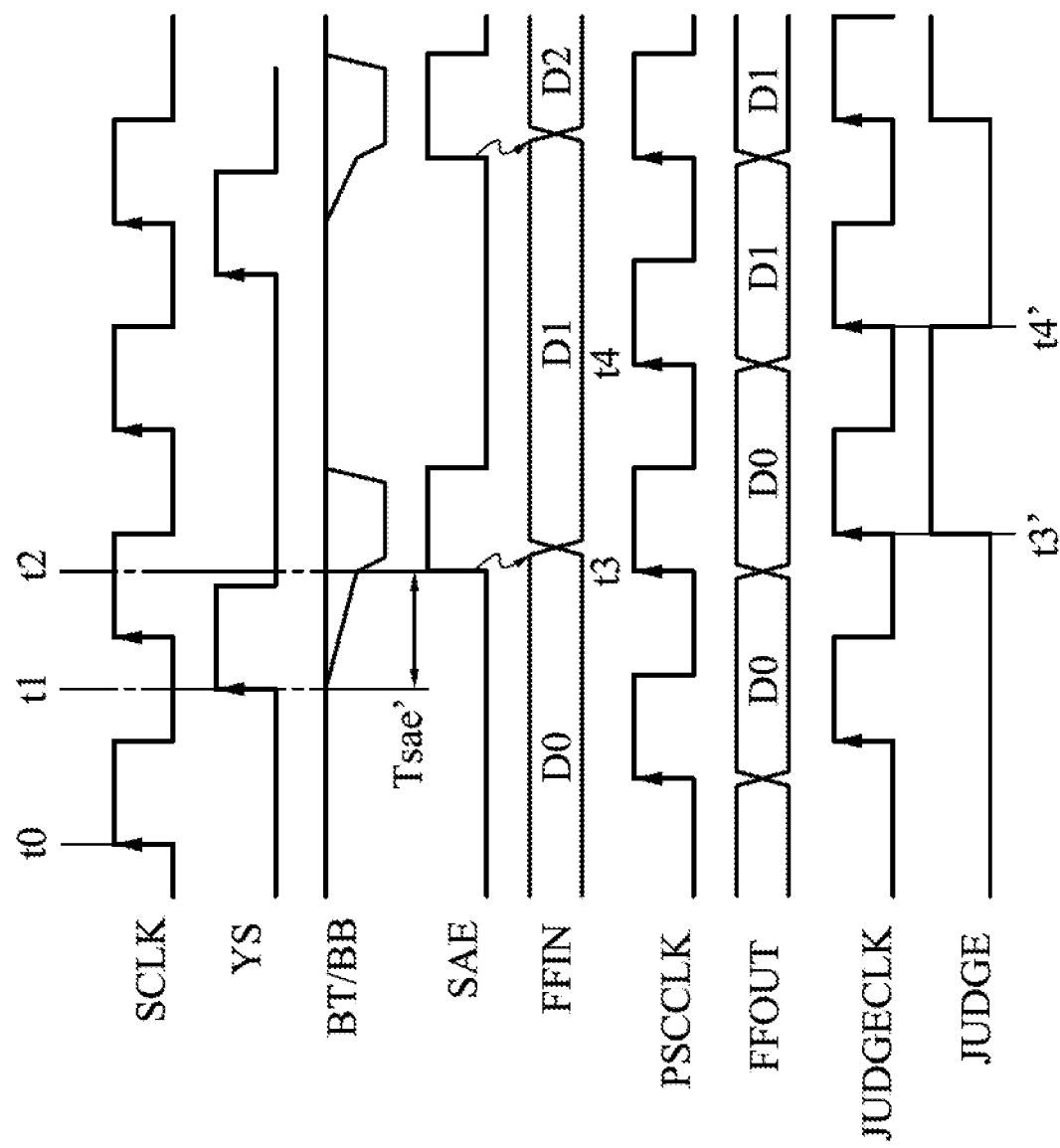

Next, the operation of the verification circuit of this embodiment will be described with reference to FIGS. 5A and 5B. FIG. 5A shows the timing chart when the read-out data from the differential sensing amplifiers 30 is correctly fetched to the input/output circuit 60. FIG. 5B shows the timing chart when the read-out data from the differential sensing amplifiers 30 is not correctly fetched to the input/output circuit 60.

As shown in FIG. 5A, at the time point t0, a serial clock signal SCLK having a high operation frequency is input from the outside. At the time point t1, the column selection signal YS is output to the column selection circuit and 8-bit data is selected from the page data held in the page buffer 10. The 8-bit data is output to the bit line pairs BT/BB of the data bus 40. Next, at the time point t2 occurring after the time point t1 by the time Tsae, the timing control circuit 50A outputs the activation signal SAE, and the differential sensing amplifiers 30 output the data D1[7:0] in response to the activation signal SAE. Next, at time point t3, the timing control circuit 50A outputs the clock signal PSCCLK in the first cycle, and the input/output circuit 60 fetches the 4-bit data D1[7:4] from the differential sensing amplifiers 30 in response to the rising edge of the clock signal PSCCLK. The data D1[7:4] is output from four I/O terminals simultaneously. Next, at the time point t4, the input/output circuit 60 fetches the remaining 4-bit data D1[3:0] from the differential sensing amplifiers 30 in response to the clock signal PSCCLK in the second cycle, and the data D1[3:0] is output from four I/O terminals simultaneously.

Here, the duplication circuit 110 performs the same operation as described above and, at the time point t3, fetches the data sensed by the differential sensing amplifier 30A to the flip-flop FF-1 in response to the clock signal PSCCLK in the first cycle. The input data FFIN of the flip-flop FF-1 is the data D1, and the output data FFOUT of the flip-flop FF-1 is the data D1. Since the data FFIN is the same as the data FFOUT, the output of the EX-OR circuit 120 becomes to the L level. At the time point t3' slightly delayed from the time point t3, the determination clock signal JUDGECLK is input to the flip-flop FF-2, and the output of the EX-OR circuit 120 is input to the flip-flop FF-2 and output to the timing control circuit 50A as the determination signal JUDGE. Since the determination signal JUDGE is at the L level, the timing control circuit 50A maintains the timing of generating the activation signal SAE as its original state. Also, at time point t4, the data in the second cycle is fetched to the input/output circuit 60 by the clock signal PSCCLK in the second cycle. At the time point t4', since the data FFIN is the same as the data FFOUT, the determination signal JUDGE with the L level is output to the timing control circuit 50A.

Accordingly, when the read-out data is transmitted to the input/output circuit 60 from the page buffer 10 by the pipeline, if the read-out data is correctly transmitted, the determination signal JUDGE becomes to the L level, and the timing control circuit 50A controls the rising edge of the activation signal SAE by using an appropriate time Tsae starting from the time point t1 at which the selection signal YS is output.

On the other hand, FIG. 5B shows an example where the timing control circuit 50A controls the rising edge of the activation signal SAE at an inappropriate time Tsae' starting from the time point t1 at which the selection signal YS is output. Ideally, the time Tsae' is substantially the same as the time period during which the potential difference between the bit line pair BT/BB can be sensed. However, if the time Tsae' is set to exceed a required margin, at the time point t2, the fetching of the read-out data by the differential sensing amplifiers 30 is delayed. As a result, at the time point t3 at which the rising edge of the clock signal PSCCLK in the first cycle occurs, the differential sensing amplifier 30 fetches the data D0 which occurs before the data D1 is sensed to the flip-flop FF-1. After the data D0 is fetched to the input/output circuit 60, since the differential sensing amplifier 30 senses the data D1, the input data FFIN of the EX-OR circuit 120 is the data D1 and the input data FFOUT thereof is the data D0 at this time. Since the input data FFIN is different from the input data FFOUT, the output of the EX-OR circuit 120 becomes to the H level. When the determination clock signal JUDGECLK is input to the flip-flop FF-2 at time point t3', the H level of the EX-OR circuit 120 is fetched into the flip-flop FF-2 and the determination signal JUDGE with the H level is fed back to the timing control circuit 50A. The timing control circuit 50A determines that the read-out data is incorrect according to the determination signal JUDGE with the H level and shortens the time Tsae' by advancing the timing of the activation signal SAE. Normally, a sufficient margin is included in the time Tsae' during which the differential sensing amplifier 30 can sense the potential difference between the bit line pairs BT/BB, so timing adjustment can be achieved by decreasing the margin. The timing control circuit 50A can automatically control the timing of the activation signal SAE by switching the fed-back determination signal JUDGE to the L level.

As described above, according to the present embodiment, when the read-out data is output in synchronization with the serial clock signal having the fast operation frequency, it is possible to verify whether the read-out data is correct. Furthermore, when the read-out data is incorrect, the timing of the activation signal SAE can be automatically adjusted in response to the determination result.

In the above embodiment, the correctness of the read-out data is verified by using the duplication circuit 110, however, the present invention is not limited to this. According to other embodiments, it is also possible to verify the correctness of the read-out data by using the page buffer, the differential sensing amplifiers, and the flip-flops. In another preferred embodiment, the correctness of the read-out data can be verified in the memory test mode.

The above embodiment in which the number of I/O terminals is 4 (m=4) and the bit width of the data bus 40 is 8 (n=8) is an example, but the present invention is not limited to the above. The present invention can also be applied to the memories with other numbers of I/O terminals and other bit widths of the data bus. For example, if the number of I/O terminals is 2 and the bit width of the data bus is 16, the internal clock signal PSCCLK of 8 cycles is required during one cycle of the activation signal SAE. In this case, the verification circuit 100 can verify whether the read-out data is correct. In the above embodiment, the determination operation is performed by the EX-OR circuit 120, but this is only an example. In other embodiments, whether the read-out data is correct can be achieved by comparing the data input to the input/output circuit 60 and the data output from the input/output circuit 60 through another logic or circuit.

Furthermore, the verification circuit 100 is not necessarily configured in an NAND flash memory. The verification circuit 100 may be connected to an external circuit of the NAND flash memory and verify the read-out data from the outside. In the above embodiment, a NAND flash memory is exemplified, but the present invention can also be applied to other memories which serially output read-out data.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). For example, it should be understood that the system, device and method may be realized in software, hardware, firmware, or any combination thereof. Therefore, the scope of the appended claims should be accorded the broadest interpretation so as to encompass all such modifications and similar arrangements.

What is claimed is:

1. A semiconductor memory device comprising:
    a column selection circuit selecting n-bit data from data read from a memory cell array according to a column selection signal and outputting the selected n-bit data to an n-bit data bus;
    a sensing circuit sensing the n-bit data on the n-bit data bus in response to an activation signal;
    an output circuit selecting m-bit data from the n-bit data sensed by the sensing circuit in response to an internal clock signal synchronized with a serial clock signal applied from outside and outputting the selected m-bit data from output terminals; and
    a verification circuit comparing the data n-bit sensed by the sensing circuit with the m-bit data output by the output circuit to verify correctness of read-out data,
    wherein m is an integer which is equal to 1 or larger than 1 and n≥m, and the internal clock signal having n/m cycles is generated in one cycle of the activation signal.

2. The semiconductor memory device as claimed in claim 1, wherein the verification circuit verifies the correctness of the read-out data which is a farthest data in view of the column selection signal.

3. The semiconductor memory device as claimed in claim 1, further comprising:
    a timing control circuit controlling timing of the activation signal according to a verification result of the verification circuit.

4. The semiconductor memory device as claimed in claim 3, wherein when the verification circuit verifies that the read-out data is incorrect, the timing control circuit controls the timing of the activation signal by advancing a time at which the sensing circuit starts sensing the data.

5. The semiconductor memory device as claimed in claim 1, wherein the output circuit comprises a conversion circuit converting a data which is input in parallel into a data which is output in serial in response to the internal clock signal.

6. The semiconductor memory device as claimed in claim 1, wherein the verification circuit preferably comprises a duplication circuit which is formed by duplicating a part of a page buffer, differential sensing amplifiers, and the input/output circuit.

7. The semiconductor memory device as claimed in claim 1, wherein the verification circuit comprises:
    a determination circuit determining whether the read-out data is correct, wherein the determination circuit receives first data and second data, wherein the first data is a sensing output of the sensing circuit, and the second data is an output which is delayed from the sensing output through a first flip-flop of the output circuit.

8. The semiconductor memory device as claimed in claim 7, further comprising:
    a second flip-flop triggered by a determination clock signal to receive an output of the determination circuit, wherein the determination clock signal is delayed from the internal clock signal.

9. A data reading method for a semiconductor memory device comprising:
    selecting page data of a memory cell array according to a column address;
    selecting n-bit data from the page data according to a column selection signal and outputting the selected n-bit data to an n-bit data bus;
    sensing the n-bit data on the n-bit data bus in response to an activation signal;
    selecting m-bit data from the sensed n-bit data in response to an internal clock signal synchronized with a serial clock signal applied from outside and outputting the selected m-bit data from output terminals; and
    comparing the sensed n-bit data with the selected m-bit data to verify correctness of read-out data, wherein m is an integer which is equal to 1 or larger than 1 and n≥m, and the internal clock signal having n/m cycles is generated in one cycle of the activation signal.

10. The data reading method as claimed in claim 9, further comprising:
    controlling timing of the activation signal when it is verified that the read-out data is incorrect.

* * * * *